(12) United States Patent
Aratake

(10) Patent No.: US 8,373,334 B2
(45) Date of Patent: Feb. 12, 2013

(54) PIEZOELECTRIC VIBRATING REED, PIEZOELECTRIC VIBRATOR, METHOD OF MANUFACTURING PIEZOELECTRIC VIBRATOR, OSCILLATOR, ELECTRONIC APPARATUS, AND RADIO-CONTROLLED TIMEPIECE

(75) Inventor: Kiyoshi Aratake, Chiba (JP)

(73) Assignee: Seiko Instruments Inc., Chiba (JP)

( * ) Notice: Subject to any disclaimer, the term of this patent is extended or adjusted under 35 U.S.C. 154(b) by 286 days.

(21) Appl. No.: 12/950,708

(22) Filed: Nov. 19, 2010

(65) Prior Publication Data

US 2011/0127882 A1 Jun. 2, 2011

(30) Foreign Application Priority Data

Nov. 27, 2009 (JP) ................................. 2009-270469

(51) Int. Cl.
*H03H 9/21* (2006.01)
*H01L 41/047* (2006.01)
(52) U.S. Cl. ........ 310/370; 310/340; 310/364; 29/25.35
(58) Field of Classification Search .................. 310/340, 310/364, 370; 29/25.35
See application file for complete search history.

(56) References Cited

U.S. PATENT DOCUMENTS

| | | | |
|---|---|---|---|
| 7,589,453 B2 * | 9/2009 | Meister et al. ............. | 310/313 R |
| 2008/0030107 A1 * | 2/2008 | Dalla Piazza ................. | 310/370 |
| 2010/0079558 A1 * | 4/2010 | Shimada ......................... | 347/71 |
| 2010/0133958 A1 * | 6/2010 | Umeki et al. ................. | 310/364 |
| 2010/0244630 A1 * | 9/2010 | Wada ............................ | 310/340 |

FOREIGN PATENT DOCUMENTS

JP 2001-144581 A 5/2001

* cited by examiner

*Primary Examiner* — Thomas M Dougherty
(74) *Attorney, Agent, or Firm* — Brinks Hofer Gilson & Lione

(57) ABSTRACT

There are provided a piezoelectric vibrating reed which can be reliably bonded ultrasonically and which can be efficiently manufactured, a piezoelectric vibrator, a method of manufacturing a piezoelectric vibrator, an oscillator, an electronic apparatus, and a radio-controlled timepiece. A piezoelectric vibrating reed includes: a piezoelectric plate having vibrating portions and a base portion adjacent to the vibrating portions; excitation electrodes formed in the vibrating portions; mount electrodes formed in the base portion; lead-out electrodes for making the excitation electrodes and the mount electrodes electrically connected to each other; and a passivation film which is formed of an electrically insulating material and covers the excitation electrodes and the lead-out electrodes. These electrodes disposed on one surface of the base portion are formed only in a region covered by the passivation film.

17 Claims, 11 Drawing Sheets

PIEZOELECTRIC VIBRATING REED, PIEZOELECTRIC VIBRATOR, METHOD OF MANUFACTURING PIEZOELECTRIC VIBRATOR, OSCILLATOR, ELECTRONIC APPARATUS, AND RADIO-CONTROLLED TIMEPIECE

RELATED APPLICATIONS

This application claims priority under 35 U.S.C. §119 to Japanese Patent Application No. 2009-270469 filed on Nov. 27, 2009, the entire content of which is hereby incorporated by reference.

BACKGROUND OF THE INVENTION

1. Field of the Invention

The present invention relates to a piezoelectric vibrating reed, a piezoelectric vibrator, a method of manufacturing a piezoelectric vibrator, an oscillator, an electronic apparatus, and a radio-controlled timepiece.

2. Description of the Related Art

In recent years, piezoelectric vibrators using crystal or the like are used in mobile phones or portable information terminals as a time source, a control signal timing source, a reference signal source, and the like. Various piezoelectric vibrators are available as such kinds of piezoelectric vibrators. For example, a piezoelectric vibrator in which a so-called tuning fork type piezoelectric vibrating reed is sealed in a package or a piezoelectric vibrator in which a so-called AT cut type piezoelectric vibrating reed is sealed in a package is known.

For example, as disclosed in JP-A-2001-144581, a tuning fork type piezoelectric vibrating reed is formed by a thin plate shaped crystal piece in which two arms (equivalent to vibrating portions in this application) extend from a base portion. Moreover, a pair of excitation electrodes is formed at a predetermined distance therebetween on each of the upper and lower surfaces of each arm of the piezoelectric vibrating reed. In addition, a pair of mount electrodes is formed on each of the upper and lower surfaces of the base portion, and is electrically connected to the pair of excitation electrodes through a pair of lead-out electrodes.

The excitation electrodes and the lead-out electrodes are formed by single films made of chromium, for example, and are covered by an insulating film (equivalent to a passivation film in this application) for preventing short-circuiting. On the other hand, an electrode film for the mount electrodes is formed by a laminated film of chromium (Cr) and gold (Au), for example. Here, the mount electrodes are exposed from the passivation film.

Then, the mount electrodes of the piezoelectric vibrating reed are mounted on internal electrodes of a package. Thus, a piezoelectric vibrator is formed. As a method of mounting a piezoelectric vibrating reed, a method is effective in which a piezoelectric vibrating reed is picked up using a bonding head of a flip chip bonder and then mount electrodes of the picked piezoelectric vibrating reed are pressed against bumps on internal electrodes and the bonding head is made to vibrate ultrasonically so that the mount electrodes and the bumps are ultrasonically bonded to each other.

However, if the bonding head comes in contact with the mount electrode exposed from the upper surface of the base portion while the bonding head is vibrating ultrasonically, there is a possibility that an electrode material, such as gold, on the mount electrode surface, will adhere to the bonding head. Moreover, if a piezoelectric vibrating reed to be mounted next is picked up by the bonding head in a state where an electrode material adheres to the bonding head, the electrode material enters between the bonding head and the piezoelectric vibrating reed to be mounted next. Even if ultrasonic bonding is performed in this state, the bonding head cannot apply ultrasonic vibration to the piezoelectric vibrating reed. As a result, the mount electrode and the bump may not be ultrasonically bonded to each other. Moreover, since the electrode material enters between the piezoelectric vibrating reed and the bonding head even if the mount electrode and the bump could be ultrasonically bonded, the piezoelectric vibrating reed may be bonded in an inclined state. Then, interference with a package may occur when the piezoelectric vibrating reed bonded in the inclined state vibrates. As a result, manufacturing failure, such as a situation where the piezoelectric vibrating reed cannot be made to vibrate at a predetermined frequency, may occur.

In addition, it is also possible to set a head cleaning step of moving a bonding head and wiping an electrode material adhering to the bonding head by rubbing using a cleaning pad, for example, after a predetermined number (for example, about 10 to 20 times) of piezoelectric vibrating reed mounting steps have ended. However, when the head cleaning step is set, the number of steps in manufacturing a piezoelectric vibrator increases.

SUMMARY OF THE INVENTION

Therefore, it is an object of the invention to provide a piezoelectric vibrating reed which can be reliably bonded ultrasonically and which can be efficiently manufactured, a piezoelectric vibrator, a method of manufacturing a piezoelectric vibrator, an oscillator, an electronic apparatus, and a radio-controlled timepiece.

In order to solve the above-described problems, according to an aspect of the invention, a piezoelectric vibrating reed includes: a piezoelectric plate having a vibrating portion and a base portion adjacent to the vibrating portion; an excitation electrode formed in the vibrating portion; a mount electrode formed in the base portion; a lead-out electrode for making the excitation electrode and the mount electrode electrically connected to each other; and a passivation film which is formed of an electrically insulating material and covers the excitation electrode and the lead-out electrode. These electrodes disposed on one surface of the base portion are formed only in a region covered by the passivation film.

According to the aspect of the invention, the electrodes disposed on one surface of the base portion are formed only in the region covered by the passivation film. For this reason, since a bonding head and each of the electrodes do not come in contact with each other when mounting the piezoelectric vibrating reed by ultrasonic bonding, an electrode material does not adhere to the bonding head. Accordingly, an electrode material does not enter between the piezoelectric vibrating reed and the bonding head when picking up another piezoelectric vibrating reed, which is to be mounted next, after mounting the piezoelectric vibrating reed. As a result, since ultrasonic vibration of the bonding head can be reliably applied to the piezoelectric vibrating reed to be mounted next, the piezoelectric vibrating reed can be reliably bonded ultrasonically. Moreover, since an electrode material does not enter between the piezoelectric vibrating reed and the bonding head, manufacturing failure, such as a situation where a piezoelectric vibrating reed is bonded in an inclined state, can be prevented. In addition, since an electrode material does not adhere to the bonding head, a head cleaning step is not needed after the mounting step ends. In this manner, the piezoelectric vibrator can be efficiently manufactured.

In addition, the mount electrode may be formed only on the other surface of the base portion, and the passivation film on one surface of the base portion and the passivation film on the other surface of the base portion may be formed in the same region in plan view.

Since the passivation film serves to prevent the electrodes of the vibrating portion from being short-circuited, it is necessary to form the passivation film so as to cover the electrodes of the vibrating portion. On the other hand, it is necessary to form the passivation film such that the mount electrode used for mounting of a piezoelectric vibrating reed is exposed. In the invention described above, the mount electrode is formed only on the other surface of the base portion and is not formed on one surface of the base portion. Accordingly, even if a passivation film on one surface of the base portion is formed in the same region as a passivation film on the other surface of the base portion, electrodes disposed on one surface of the base portion can be covered by the passivation film. Thus, since the passivation films on both surfaces of the piezoelectric vibrating reed are formed in the same region, a metal mask for making the passivation films can be used in common. As a result, a piezoelectric vibrating reed can be provided at low cost.

In addition, according to another aspect of the invention, a piezoelectric vibrator includes the above-described piezoelectric vibrating reed and a package in which the above-described piezoelectric vibrating reed is housed. The mount electrode formed on the other surface of the base portion is mounted in the package through a bump.

According to the aspect of the invention, since an electrode material does not adhere to a bonding head, the electrode material does not enter between the piezoelectric vibrating reed and the bonding head. Accordingly, the piezoelectric vibrating reed can be reliably bonded ultrasonically. In addition, it is possible to prevent manufacturing failure, such as a situation where a piezoelectric vibrating reed is bonded in an inclined state. Moreover, since a head cleaning step is not needed after the mounting step ends, the piezoelectric vibrator can be efficiently manufactured.

In addition, according to still another aspect of the invention, a method of manufacturing a piezoelectric vibrator includes a step of mounting the mount electrode, which is formed on the other surface of the base portion, on the package through the bump. In the mounting step, the mount electrode is mounted on the package through the bump by applying ultrasonic vibration in a state where a bonding head is pressed against one surface of the base portion.

According to the aspect of the invention, since an electrode material does not adhere to a bonding head, the electrode material does not enter between the piezoelectric vibrating reed and the bonding head. Accordingly, the piezoelectric vibrating reed can be reliably bonded ultrasonically. Moreover, manufacturing failure of a piezoelectric vibrating reed in a mounting step can be prevented. Moreover, since a head cleaning step is not needed after the mounting step, the piezoelectric vibrator can be efficiently manufactured.

According to still another embodiment of the present invention, there is provided an oscillator in which the above-described piezoelectric vibrator is electrically connected to an integrated circuit as a vibrator.

According to still another embodiment of the present invention, there is provided an electronic apparatus in which the above-described piezoelectric vibrator is electrically connected to a timing unit.

According to still another embodiment of the present invention, there is provided a radio-controlled timepiece in which the above-described piezoelectric vibrator is electrically connected to a filter section.

Since each of the oscillator, the electronic apparatus, and the radio-controlled timepiece according to the aspects of the invention includes the piezoelectric vibrator in which a piezoelectric vibrating reed can be reliably bonded ultrasonically and which can be efficiently manufactured, it is possible to provide an oscillator, an electronic apparatus, and a radio-controlled timepiece which have good performance at low cost.

According to the aspect of the invention, the electrodes disposed on one surface of the base portion are formed only in the region covered by the passivation film. For this reason, since a bonding head and each of the electrodes do not come in contact with each other when mounting the piezoelectric vibrating reed by ultrasonic bonding, an electrode material does not adhere to the bonding head. Accordingly, an electrode material does not enter between the piezoelectric vibrating reed and the bonding head when picking up another piezoelectric vibrating reed, which is to be mounted next, after mounting the piezoelectric vibrating reed. As a result, since ultrasonic vibration of the bonding head can be reliably applied to the piezoelectric vibrating reed to be mounted next, the piezoelectric vibrating reed can be reliably bonded ultrasonically. Moreover, since an electrode material does not enter between the piezoelectric vibrating reed and the bonding head, manufacturing failure, such as a situation where a piezoelectric vibrating reed is bonded in an inclined state, can be prevented. In addition, since an electrode material does not adhere to the bonding head, a head cleaning step is not needed after the mounting step ends. In this manner, a piezoelectric vibrator can be efficiently manufactured.

BRIEF DESCRIPTION OF THE DRAWINGS

FIG. 10A is a plan view, and FIG. 10B is a sectional view taken along the line D-D in FIG. 10A;

DESCRIPTION OF THE PREFERRED EMBODIMENTS

Hereinafter, an embodiment of the invention will be described with reference to the accompanying drawings.

(Piezoelectric Vibrating Reed)

First, a piezoelectric vibrating reed will be described with reference to the drawings. Moreover, in the following explanation, it is assumed that the mounting surface of a piezoelectric vibrating reed is a lower surface L (other surface) and the opposite surface is an upper surface U (one surface).

Figure 1:
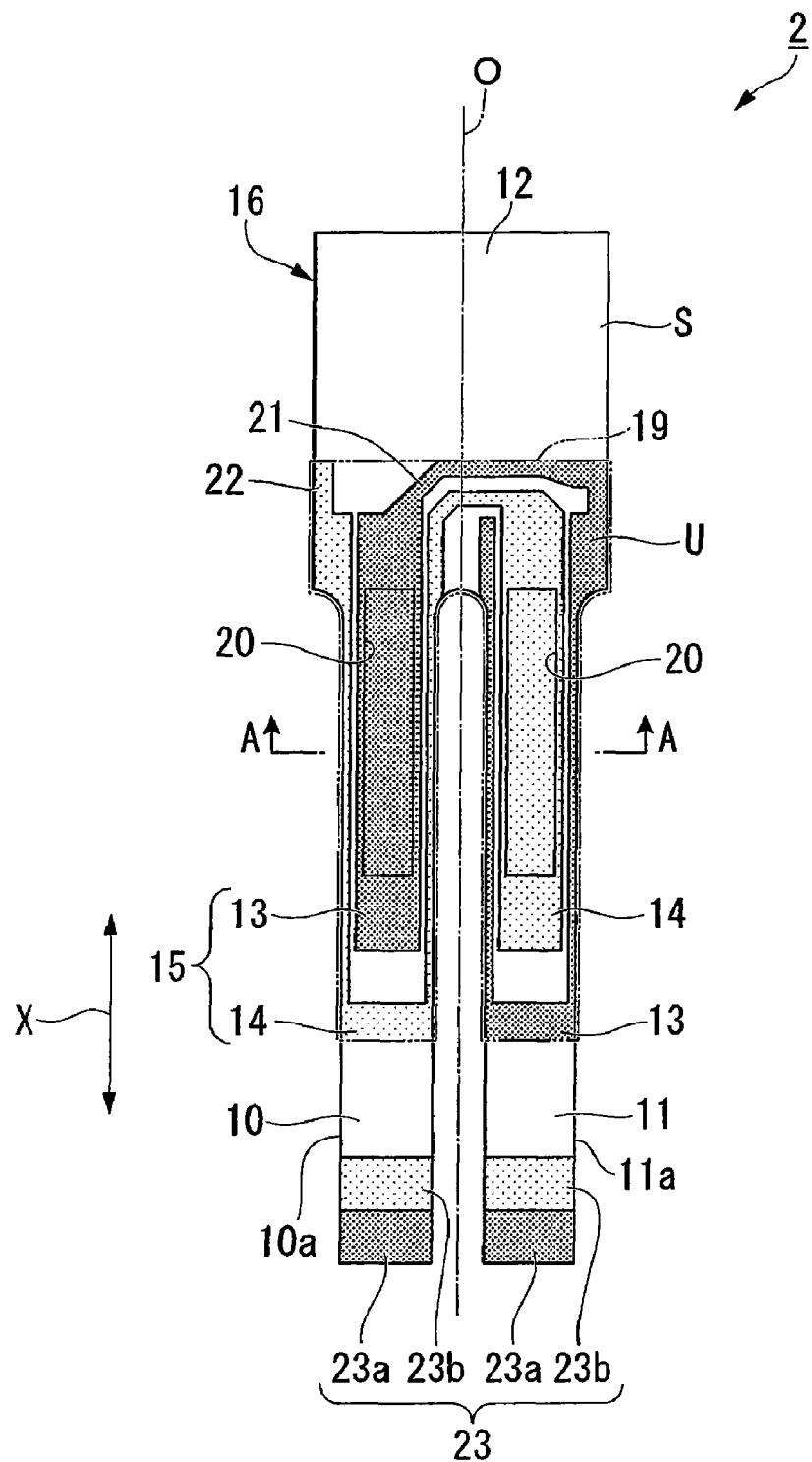
FIG. 1 is a plan view of a piezoelectric vibrating reed.

FIG. 1 is a plan view of a piezoelectric vibrating reed.

Figure 2:
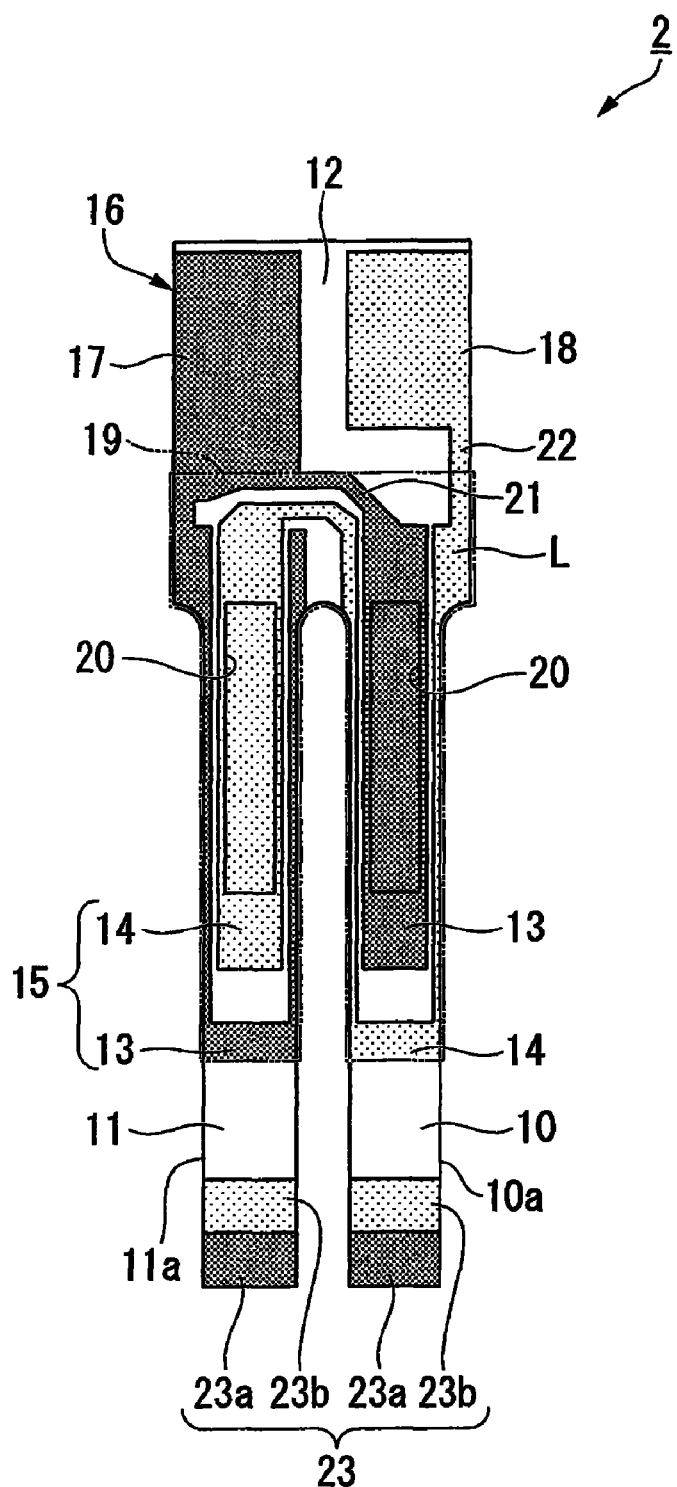
FIG. 2 is a bottom view of a piezoelectric vibrating reed.

FIG. 2 is a bottom view of a piezoelectric vibrating reed.

Figure 3:
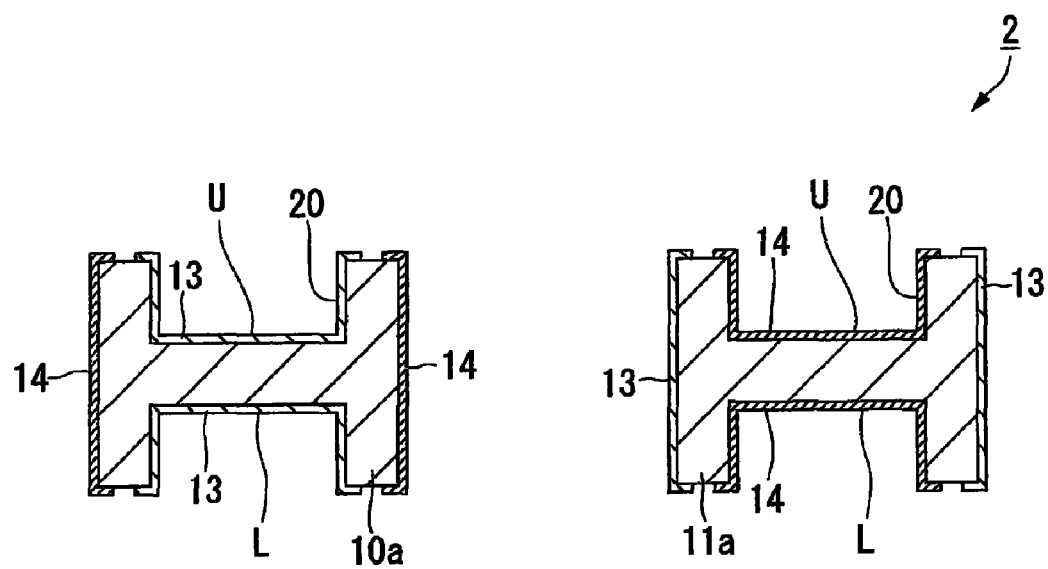
FIG. 3 is a sectional view taken along the line A-A in FIG. 1.

FIG. 3 is a sectional view taken along the line A-A in FIG. 1.

Moreover, in FIG. 3, a passivation film, which will be described later, is not shown in order to make the drawing easily understood.

As shown in FIGS. 1 and 2, a piezoelectric vibrating reed 2 according to the present embodiment includes: a piezoelectric plate 16 which has vibrating portions 10 and 11 and a base portion 12 adjacent to the vibrating portions 10 and 11; excitation electrodes 13 and 14 formed in the vibrating portions 10 and 11; mount electrodes 17 and 18 formed in the base portion 12; lead-out electrodes 21 and 22 for making the excitation electrodes 13 and 14 and the mount electrodes 17 and 18 electrically connected to each other; and a passivation film 19 which is formed of an electrically insulating material and covers the excitation electrodes 13 and 14 and the lead-out electrodes 21 and 22. These electrodes disposed on the upper surface U of the base portion 12 are formed only in a region covered by the passivation film 19.

The piezoelectric vibrating reed 2 according to the present embodiment includes the piezoelectric plate 16 having the vibrating portions 10 and 11 and the base portion 12 adjacent to the vibrating portions 10 and 11.

The piezoelectric plate 16 is a tuning fork type member formed of a piezoelectric material, such as crystal, lithium tantalate, or lithium niobate, and vibrates when a predetermined voltage is applied.

As shown in FIG. 1, the vibrating portions 10 and 11 have a pair of vibrating arms 10a and 11a which are disposed in parallel at the left and right sides of the central axis O. On the main surfaces (top and bottom surfaces) of the pair of vibrating arms 10a and 11a, longitudinal grooves 20 are formed to have a fixed width along the longitudinal direction X of the vibrating arms 10a and 11a. The grooves 20 are formed in a range exceeding intermediate portions from the base end sides of the vibrating arms 10a and 11a. As a result, each of the pair of vibrating arms 10a and 11a has an H-shaped section as shown in FIG. 3.

As shown in FIGS. 1 and 2, the base portion 12 is adjacent to the vibrating portions 10 and 11 and supports base ends of the vibrating portions 10 and 11.

In the present embodiment, the piezoelectric vibrating reed 2 includes: the excitation electrodes 13 and 14 formed in the vibrating portions 10 and 11; the mount electrodes 17 and 18 formed in the base portion 12; and the lead-out electrodes 21 and 22 for making the excitation electrodes 13 and 14 and the mount electrodes 17 and 18 electrically connected to each other, as shown in FIGS. 1 and 2.

The pair of excitation electrodes 13 and 14 is formed on the pair of main surfaces of the vibrating arms 10a and 11a, as shown in FIGS. 1 to 3. The pair of excitation electrodes 13 and 14 are electrodes that vibrate the pair of vibrating arms 10a and 11a at a predetermined resonance frequency in a direction of moving closer to or away from each other when a voltage is applied. The pair of excitation electrodes 13 and 14 is formed on the outer surfaces of the vibrating arms 10a and 11a by patterning in an electrically isolated state. Specifically, as shown in FIG. 3, one excitation electrode 13 is mainly formed inside the groove 20 of one vibrating arm 10a and on the side surface of the other vibrating arm 11a, and the other excitation electrode 14 is mainly formed on the side surface of one vibrating arm 10a and inside the groove 20 of the other vibrating arm 11a.

The pair of mount electrodes 17 and 18 is formed only on the lower surface L of the base portion 12. In addition, the mount electrodes 17 and 18 are electrically connected to the pair of excitation electrodes 13 and 14 through the lead-out electrodes 21 and 22, respectively. Here, since the excitation electrodes 13 and 14 on the upper surface U are electrically connected to the mount electrodes 17 and 18 on the lower surface L, parts of the lead-out electrodes 21 and 22 are also formed on the side surface of the piezoelectric vibrating reed 2. Thus, a voltage is applied to the pair of excitation electrodes 13 and 14 through the mount electrodes 17 and 18. In addition, the mount electrodes 17 and 18 are not formed on the upper surface U of the base portion 12. Moreover, the lead-out electrodes 21 and 22 disposed on the upper surface U of the base portion 12 are formed only in a region covered by the passivation film 19, as will be described later.

As shown in FIGS. 1 and 2, the mount electrodes 17 and 18 are formed on the lower surface L of the base portion 12, and the mount electrodes 17 and 18 are not formed on the upper surface U of the base portion 12. Therefore, in the piezoelectric vibrating reed 2 according to the present embodiment, electrodes are formed using different masks on the upper and lower surfaces U and L. On the other hand, in a known piezoelectric vibrating reed, electrodes of the upper and lower surfaces may be formed using top and bottom portions of one mask. In this case, however, the number of steps including mask washing increases. For this reason, also in the known piezoelectric vibrating reed, electrodes are generally formed using different masks on the upper and lower surfaces. Accordingly, in the present embodiment, the number of types of masks or the number of masks is not increased even if the mount electrodes 17 and 18 are formed only on the lower surface L. As a result, manufacturing costs are not increased in the present embodiment.

The mount electrodes 17 and 18 are laminated films of chromium (Cr) and gold (Au), and are obtained by forming a chromium film, which has good adhesion to crystal, as a base and then forming a thin gold film on the surface. However, they are not limited to the above case. For example, a thin gold film may be further laminated on the surface of a laminated film made of chromium and Nichrome (NiCr), or a single film made of chromium, nickel, aluminum (Al), or titanium (Ti), may also be adopted. The excitation electrodes 13 and 14 and the lead-out electrodes 21 and 22 are formed by single films made of only chromium and are covered by a passivation film, which will be described later.

In addition, a weight metal film 23 configured to include a rough adjustment film 23a and a fine adjustment film 23b for adjusting (frequency adjustment) the vibrating states of the pair of vibrating arms 10a and 11a to vibrate within a predetermined frequency range is formed at the distal ends of the vibrating arms 10a and 11a, as shown in FIG. 1. By performing frequency adjustment using the weight metal film 23, the frequency of the pair of the vibrating arms 10a and 11a can be set to fall within the nominal frequency range of the device.

As shown in FIGS. 1 and 2, the piezoelectric vibrating reed 2 according to the present embodiment is formed of an electrically insulating material and includes the passivation film 19 which covers the excitation electrodes 13 and 14 and the lead-out electrodes 21 and 22. The passivation film 19 is an insulating film formed of $SiO_2$ or the like. The passivation film 19 is formed by depositing a film, for example, by a CVD method after forming electrodes of the piezoelectric vibrating reed 2.

The passivation film 19 is formed on the upper and lower surfaces U and L of the vibrating portions 10 and 11 and the base portion 12 so as to cover the excitation electrodes and the lead-out electrodes.

As shown in FIGS. 1 and 2, in the piezoelectric vibrating reed 2 according to the present embodiment, electrodes disposed on the upper surface U of the base portion 12 are formed only in the region covered by the passivation film 19. Specifically, in the present embodiment, the mount electrodes 17 and 18 are formed only on the lower surface L of the base portion 12, and the mount electrodes 17 and 18 are not formed on the upper surface U of the base portion 12. In addition, the passivation film 19 on both surfaces of the base portion 12 is formed from a region where the excitation electrodes 13 and 14 on the vibrating arms 10a and 11a are formed to a region where the lead-out electrodes 21 and 22 on the base portion 12 are formed. Moreover, electrodes are not formed in a region S which is not covered by the passivation film 19 of the upper surface U of the base portion 12, and mount electrodes are exposed in the region which is not covered by the passivation film 19 of the lower surface L of the base portion 12.

Here, the passivation film 19 prevents electrodes from being short-circuited by covering the surfaces of the electrodes. The specific explanation is as follows.

As will be described later, adjustment of the frequency of the piezoelectric vibrating reed 2 is performed by changing the weight of the weight metal film 23 by irradiating a laser beam onto the weight metal film 23 to evaporate a part of the weight metal film 23. Here, the excitation electrodes 13 and 14 and the lead-out electrodes 21 and 22 are formed in a state of being electrically isolated, but the distance between the electrodes is very short because the electrodes are mainly formed in vibrating arms 10a and 11a. In addition, if particles of the weight metal film 23 which evaporate and disperse at the time of frequency adjustment adhere between electrodes, the electrodes are short-circuited. However, since the surfaces of the electrodes are covered by the passivation film 19, particles of the weight metal film 23 which disperse adhere to the passivation film 19 but do not adhere between the electrodes. Thus, the passivation film 19 prevents electrodes from being short-circuited.

In addition, the passivation film is also provided in a known piezoelectric vibrating reed in order to prevent electrodes from being short-circuited. Accordingly, in the present embodiment, since electrodes can be covered by a passivation film already in existence, an increase in manufacturing costs can be suppressed.

Here, as shown in FIGS. 1 and 2, it is preferable that the passivation film 19 of the upper surface U of the piezoelectric vibrating reed 2 and the passivation film 19 of the lower surface L of the piezoelectric vibrating reed 2 are formed in the same region in plan view. In this case, when forming the passivation film 19 using a metal mask, the upper and lower surfaces U and L of the piezoelectric vibrating reed 2 can be masked using the same metal mask. Accordingly, since a metal mask can be used in common when forming the passivation film 19, the piezoelectric vibrating reed 2 can be provided at low cost.

(Piezoelectric Vibrator)

Next, a piezoelectric vibrator using a piezoelectric vibrating reed according to the present embodiment will be described with reference to the accompanying drawings.

Figure 4:
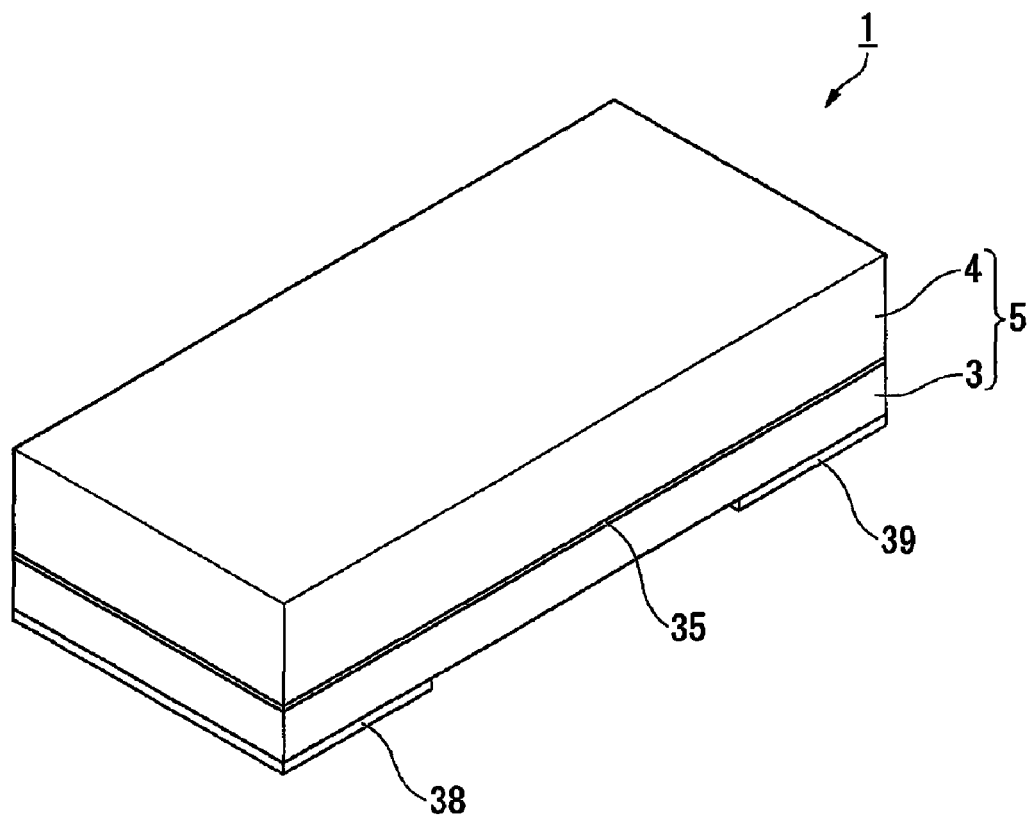
FIG. 4 is a perspective view showing the external appearance of a piezoelectric vibrator according to the present embodiment.

FIG. 4 is a perspective view showing the external appearance of a piezoelectric vibrator in the present embodiment.

Figure 5:
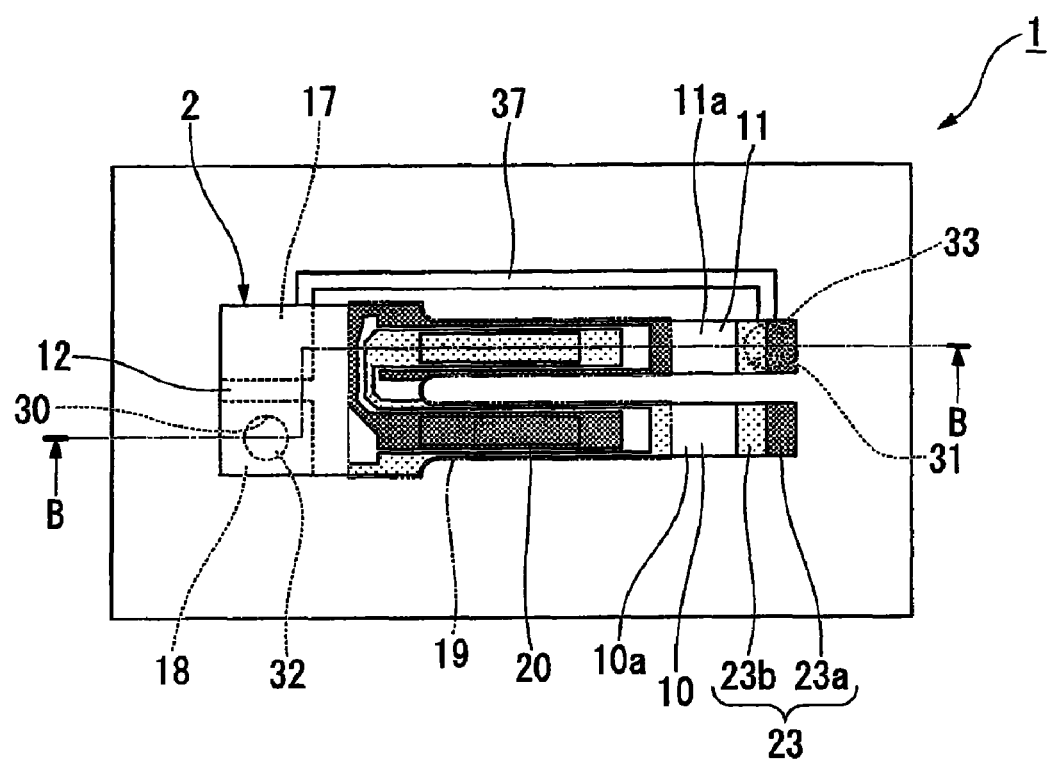
FIG. 5 is a view showing the internal configuration of the piezoelectric vibrator shown in FIG. 4 and is also a plan view in a state where a lid board is removed.

FIG. 5 is a view showing the internal configuration of the piezoelectric vibrator shown in FIG. 4 and is also a plan view in a state where a lid board is removed.

Figure 6:
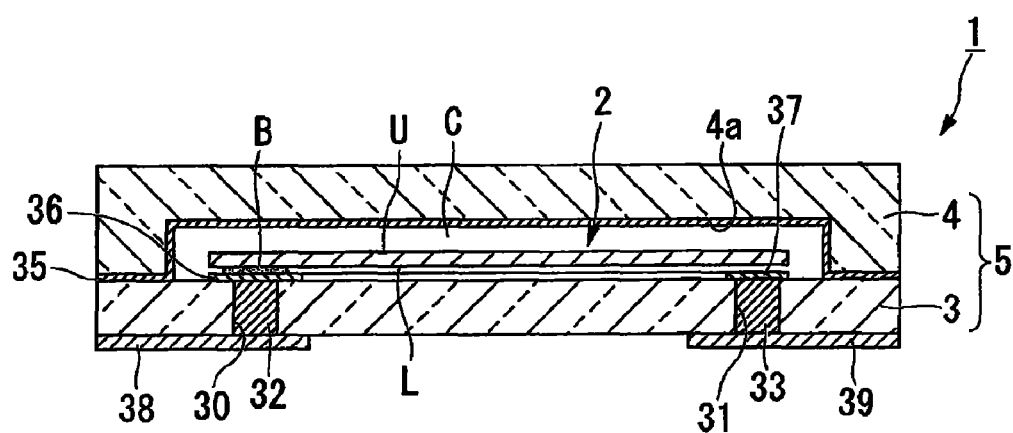
FIG. 6 is a sectional view of the piezoelectric vibrator taken along the line B-B in FIG. 5.

FIG. 6 is a sectional view of the piezoelectric vibrator taken along the line B-B in FIG. 5. Moreover, in FIG. 6, a passivation film is not shown in order to make the drawing easily understood.

Figure 7:
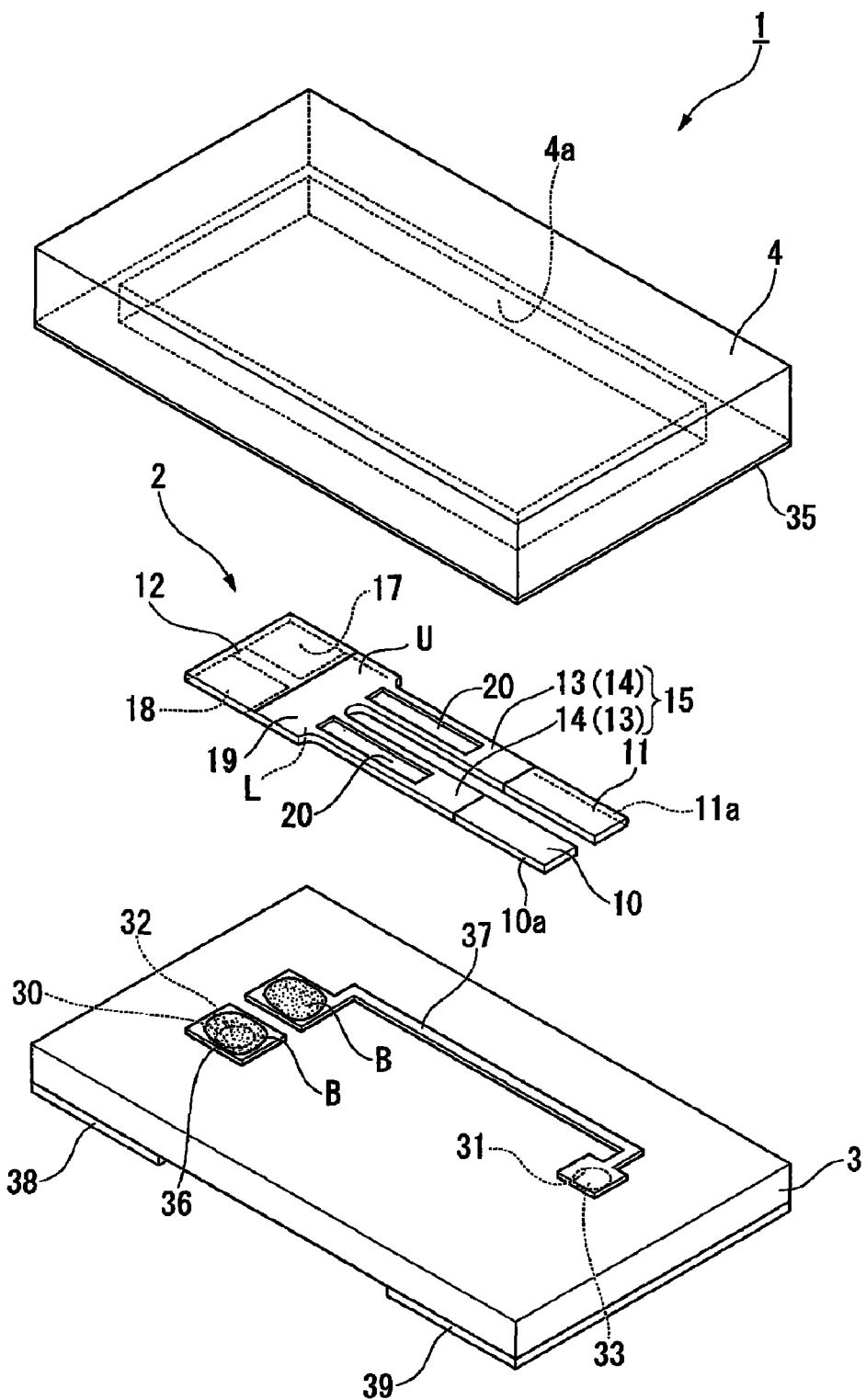
FIG. 7 is an exploded perspective view of the piezoelectric vibrator shown in FIG. 4.

FIG. 7 is an exploded perspective view of the piezoelectric vibrator shown in FIG. 4.

As shown in FIGS. 4 to 7, the piezoelectric vibrator 1 using the piezoelectric vibrating reed 2 according to the present embodiment includes the piezoelectric vibrating reed 2 and a package 5 in which the piezoelectric vibrating reed 2 is housed. Moreover, as shown in FIGS. 6 and 7, the mount electrodes 17 and 18 formed on the lower surface L of the base portion 12 are mounted in the package 5 through a bump B.

In the present embodiment, the package 5 includes a base board 3 and a lid board 4 which are superimposed to form a cavity C for housing the piezoelectric vibrating reed 2 therebetween.

The base board 3 is a transparent insulating board made of a glass material, for example, soda lime glass. As shown in FIGS. 4 to 7, the base board 3 is formed in a plate shape so that it can be superimposed on the lid board 4 which will be described later.

As shown in FIGS. 5 and 6, a pair of through holes 30 and 31 passing through the base board 3 is formed in the base board 3. The pair of through holes 30 and 31 is formed at both ends of a diagonal of the cavity C. In addition, a pair of penetration electrodes 32 and 33 formed so as to be embedded in the through holes 30 and 31 is formed in the pair of through holes 30 and 31, respectively. The penetration electrodes 32 and 33 are formed of a conductive metal material, such as stainless steel, Ag, or Al.

As shown in FIG. 7, in the piezoelectric vibrator 1 using the piezoelectric vibrating reed 2 according to the present embodiment, the mount electrodes 17 and 18 formed on the lower surface L of the base portion 12 are mounted in the package through the bump B.

A pair of lead-out electrodes 36 and 37 is formed on the upper surface of the base board 3. Each of the pair of lead-out electrodes 36 and 37 is an electrode film with a two-layer structure where a lower layer is formed of chromium and an upper layer is formed of gold, for example. Moreover, as shown in FIGS. 5 to 7, the pair of lead-out electrodes 36 and 37 is patterned such that one lead-out electrode 36 is electrically connected to one penetration electrode 32 and one mount electrode 17 of the piezoelectric vibrating reed 2 and the other lead-out electrode 37 is electrically connected to the other penetration electrode 33 and the other mount electrode 18 of the piezoelectric vibrating reed 2. In addition, each of the mount electrodes 17 and 18 is ultrasonically bonded to the bump B formed on each of the lead-out electrodes 36 and 37, as will be described later.

On the lower surface of the base board 3, external electrodes 38 and 39 electrically connected to the pair of penetration electrodes 32 and 33, respectively, are formed, as shown in FIG. 7. That is, one external electrode 38 is electrically connected to the first excitation electrode 13 of the piezoelectric vibrating reed 2 through one penetration electrode 32 and one lead-out electrode 36. That is, the other external electrode 39 is electrically connected to the second excitation electrode 14 of the piezoelectric vibrating reed 2 through the other penetration electrode 33 and the other lead-out electrode 37. As a result, a pair of excitation electrodes 15 can be electrically connected to the outside of the cavity C.

Similar to the base board 3, the lid board 4 is also a transparent insulating board made of a glass material, for example, soda lime glass, and is formed in a plate shape as shown in FIGS. 4, 6, and 7. In addition, a rectangular recess 4a in which the piezoelectric vibrating reed 2 is housed is formed on the lower surface (inner surface; a bonding surface to which the base board 3 is bonded) of the lid board 4. This recess 4a is a recess for a cavity that serves as the cavity C, in which the piezoelectric vibrating reed 2 is housed, when the base board 3 and the lid board 4 are superimposed.

Moreover, as shown in FIG. 6, a bonding film 35 for anodic bonding is formed on the bonding surface of the lid board 4 which is bonded to the base board 3. The bonding film 35 is formed of a conductive material, such as aluminum, and is formed by a film forming method, such as sputtering or CVD. In addition, the bonding film 35 may be formed on the entire inner surface of the recess 4a. In this case, since patterning of the bonding film 35 is not necessary, manufacturing costs can be reduced.

In addition, the lid board 4 is anodically bonded to the base board 3 through the bonding film in a state where the recess 4a faces the base board 3.

In order to operate the piezoelectric vibrator 1 configured as described above, a predetermined driving voltage is applied to the external electrodes 38 and 39 formed on the base board 3. Accordingly, since a voltage can be applied to the pair of excitation electrodes 15 formed by the first and second excitation electrodes 13 and 14 of the piezoelectric vibrating reed 2, the pair of vibrating arms 10a and 11a can vibrate at a predetermined frequency in a direction of moving closer to or away from each other. In addition, this vibration of the pair of vibrating arms 10a and 11a can be used as a time source, a control signal timing source, a reference signal source, and the like.

(Method of Manufacturing a Piezoelectric Vibrator)

Next, a method of manufacturing the above piezoelectric vibrator will be described referring to a flow chart.

Figure 8:
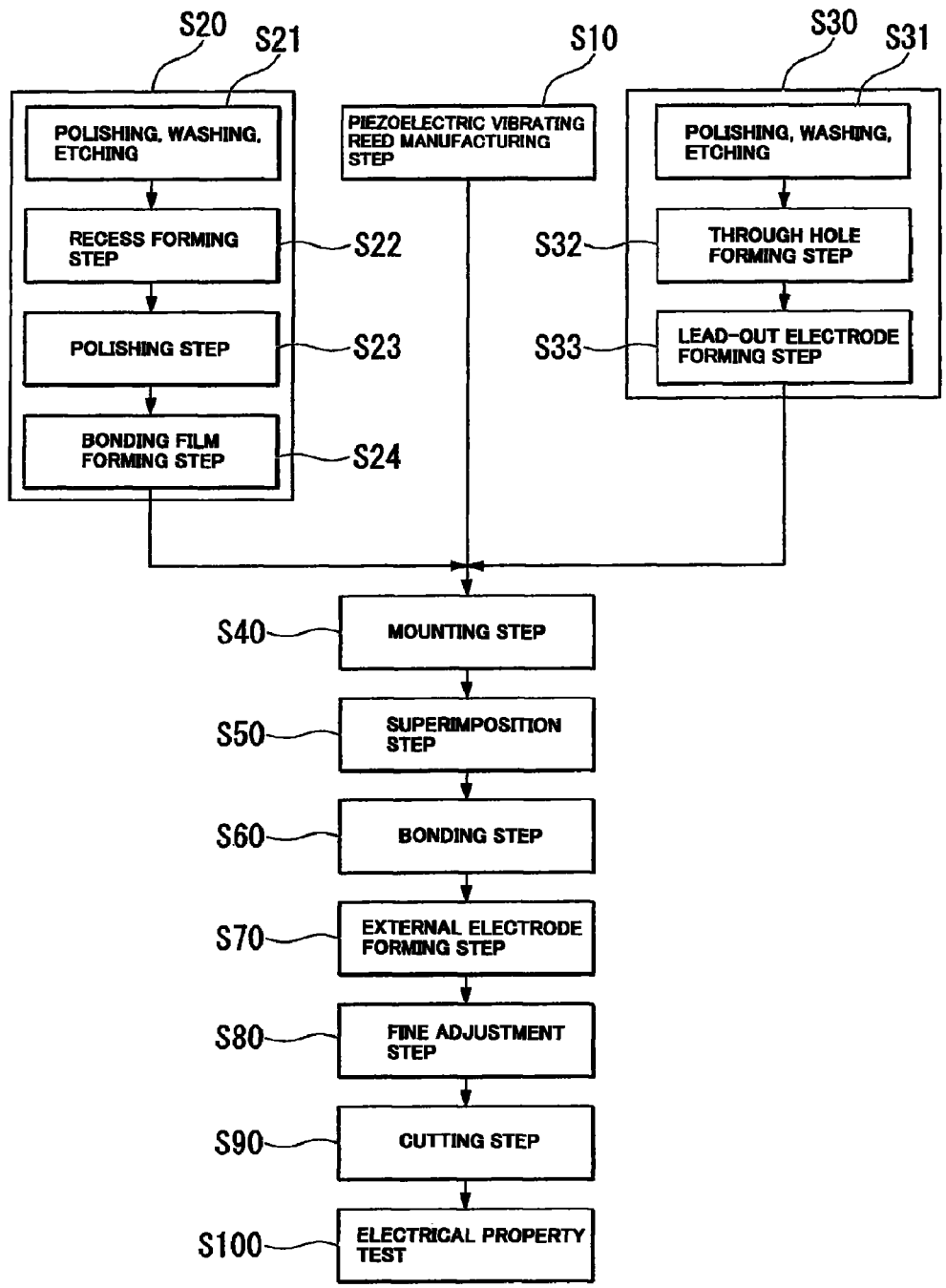
FIG. 8 is a flow chart showing a method of manufacturing a piezoelectric vibrator according to the present embodiment.

FIG. 8 is a flow chart showing the method of manufacturing a piezoelectric vibrator according to the present embodiment.

Figure 9:
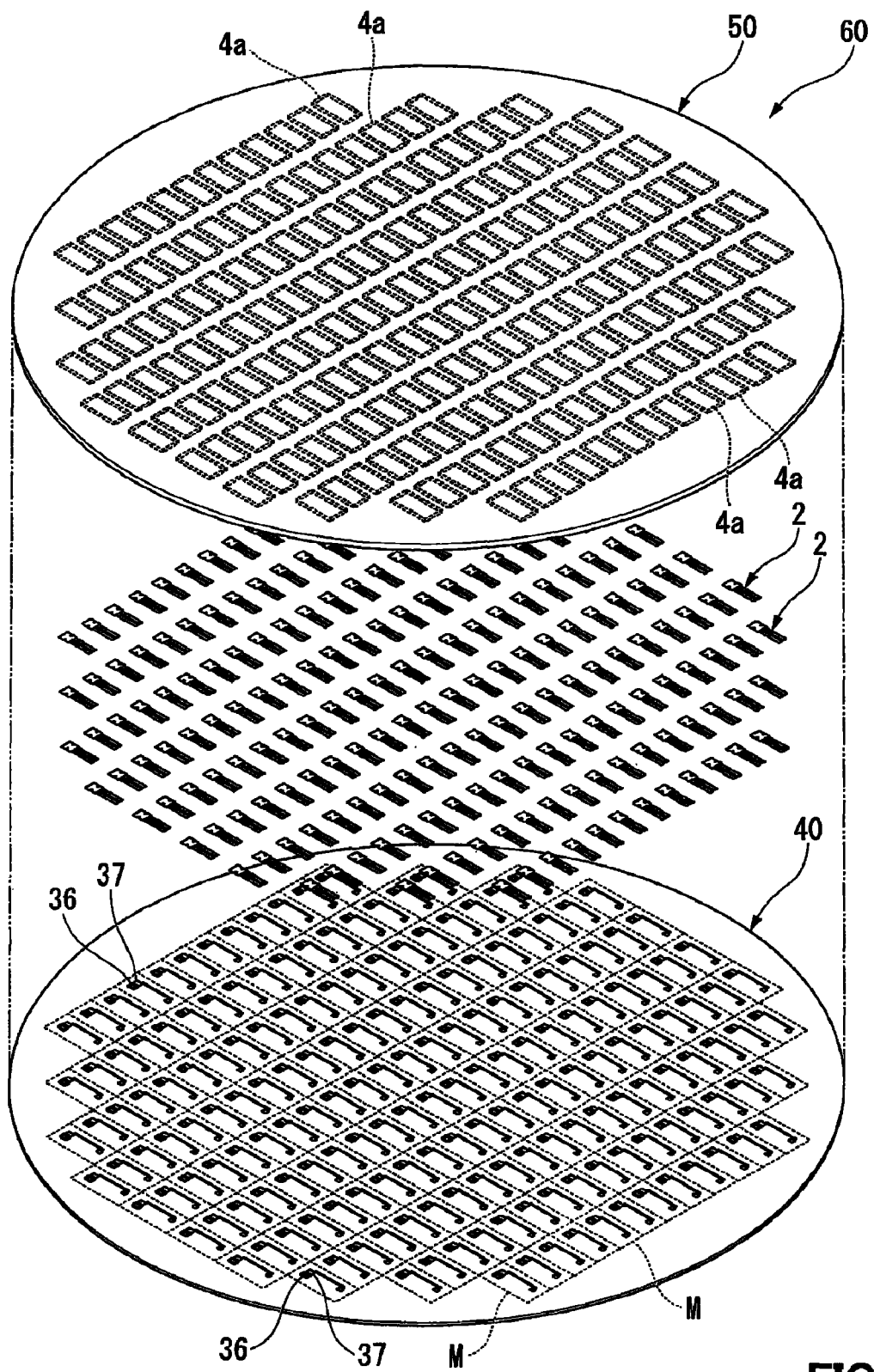
FIG. 9 is an exploded perspective view of a wafer body.

FIG. 9 is an exploded perspective view of a wafer body.

Figure 10A:
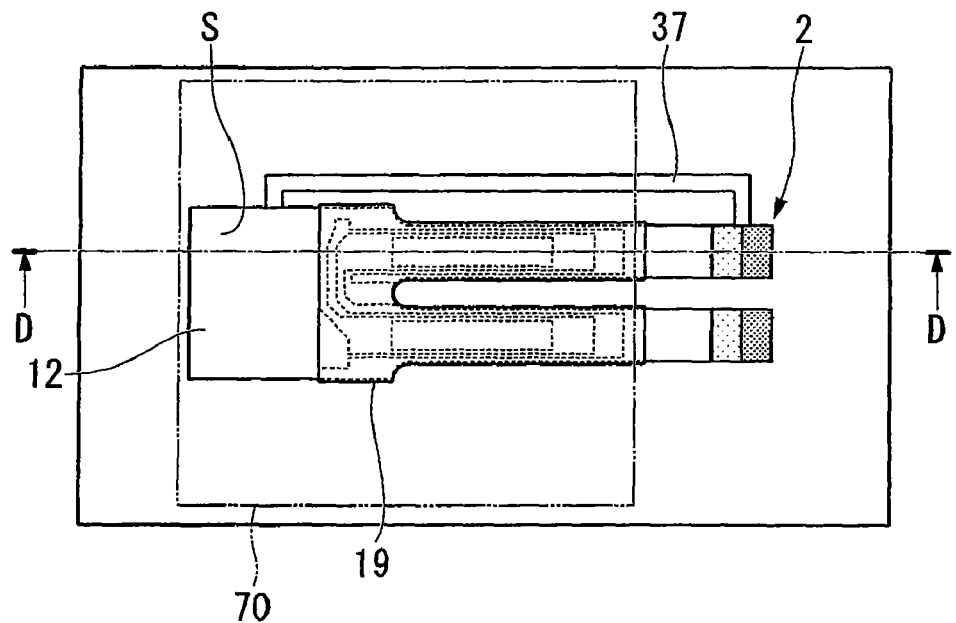
FIGS. 10A and 10B are explanatory views showing a mounting step in the present embodiment.
Figure 10B:
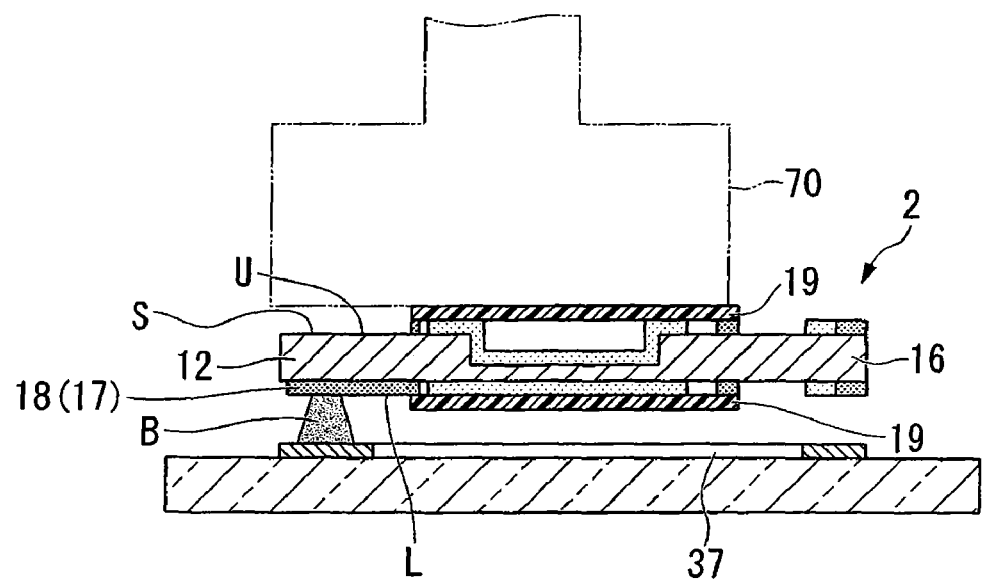

FIGS. 10A and 10B are explanatory views showing a mounting step S40 in the present embodiment. FIG. 10A is a plan view, and FIG. 10B is a sectional view taken along the line D-D in FIG. 10A. Moreover, the mounting step S40 is performed in a state of a wafer for base boards. However, in FIGS. 10A and 10B, the mounting step S40 is performed in a state where the wafer for base boards is cut into the small base boards 3 in order to make it easily understood.

First, a piezoelectric vibrating reed manufacturing step S10 is performed to manufacture the piezoelectric vibrating reed 2 shown in FIGS. 1 and 2. Specifically, first, a Lambert ore made of crystal is sliced at a predetermined angle to form a wafer with a fixed thickness. Then, the wafer is rubbed for rough processing, and the affected layer is removed by etching. Then, the wafer is subjected to mirror polishing processing, such as polishing, to make the wafer have a predetermined thickness. Then, after performing appropriate processing, such as washing, on the wafer, the wafer is patterned to have the outer shape of the piezoelectric vibrating reed 2 by a photolithographic technique and a metal film is formed and patterned. As a result, the excitation electrodes 13 and 14, the lead-out electrodes 21 and 22, the mount electrodes 17 and 18, and the weight metal film 23 are formed.

After forming the electrode films, the gold electrode film in the formation region of the passivation film 19 is removed. Accordingly, since the passivation film 19 can be formed on the electrode film, which is made of chromium, on the base, adhesion of the passivation film 19 can be improved.

Then, the passivation film 19 shown in FIGS. 1 and 2 is formed. For example, the passivation film is formed by a CVD method. When forming the passivation film 19, masking using a metal mask is performed. The metal mask is a member which is formed of stainless steel and has a thickness of about 50 μm, for example. In the metal mask, an opening is provided in a portion (portion corresponding to the entire region of excitation electrodes and lead-out electrodes in the present embodiment) where the passivation film 19 is to be formed. Here, since the region of the passivation film 19 of the upper surface U and the region of the passivation film 19 of the lower surface L are set to be equal as described above, the passivation film can be formed using the same metal mask. Accordingly, since a metal mask for forming the passivation film 19 can be used in common, the piezoelectric vibrating reed can be provided at low cost.

After forming the respective electrode films and the passivation film 19, rough adjustment of a resonance frequency is performed for the piezoelectric vibrating reed 2. Specifically, the frequency is roughly adjusted by changing the weight of the weight metal film 23 by irradiating a laser beam onto the rough adjustment film 23a of the weight metal film 23 to evaporate a part of the rough adjustment film 23a. In addition, fine adjustment for adjusting the resonance frequency more accurately is performed after mounting the piezoelectric vibrating reed 2. This will be described later.

Then, the piezoelectric vibrating reed 2 is cut off from the wafer as an individual small piece by cutting a connecting portion, which connects the wafer and the piezoelectric vibrating reed 2 to each other. In this way, the plurality of piezoelectric vibrating reeds 2 can be simultaneously manufactured from one wafer. Thus, the manufacturing of the piezoelectric vibrating reed 2 ends.

Then, as shown in FIG. 9, a first wafer manufacturing step S20 in which a wafer 50 for lid boards, which will become lid boards later, processed to a state immediately before performing anodic bonding is performed. First, soda lime glass is polished up to a predetermined thickness and washed and then the disk-shaped wafer 50 for lid boards, from which an affected layer located at the outermost surface was removed by etching or the like, is formed (S21). Then, a recess forming step S22 of forming the plurality of recesses 4a for cavity C in a matrix by etching or the like is performed on the bonding surface of the wafer 50 for lid boards. The recess 4a is formed by heat pressing, etching, or the like. Then, a polishing step S23 of polishing the bonding surface of the wafer 50 for lid boards, which is bonded to the wafer 40 for base boards, is performed.

Then, a bonding film forming step S24 of forming the bonding film 35 on the bonding surface of the wafer 50 for lid boards bonded to the wafer 40 for base boards is performed. The bonding film 35 may be formed not only on the bonding surface of the wafer 50 for lid boards bonded to the wafer 40 for base boards but also on the entire inner surface of the recess 4a. In this case, since patterning of the bonding film 35 is not necessary, manufacturing costs can be reduced. The bonding film 35 can be formed by a film forming method, such as sputtering or CVD. In addition, since the polishing step S23 is performed before the bonding film forming step S24, the flatness of the surface of the bonding film 35 is ensured. Accordingly, the bonding film 35 can be stably bonded to the wafer 40 for base boards.

Then, simultaneously with the first wafer manufacturing step or at a timing before or after the first wafer manufacturing step, a second wafer manufacturing step S30 is performed to manufacture a wafer 40 for base boards, which will become base boards later, in a state immediately before performing anodic bonding. Specifically, similar to the wafer 50 for lid boards, soda lime glass is polished up to a predetermined thickness and washed and then the disk-shaped wafer 40 for base boards, from which an affected layer located at the outermost surface was removed by etching or the like, is formed (S31).

Then, in a penetration electrode forming step S32, the pair of penetration electrodes 32 and 33 shown in FIG. 6 is formed in a plural number on the wafer 40 for base boards shown in FIG. 9. In this case, for example, the pair of through holes 30 and 31 passing through the wafer 40 for base boards is formed in a plural number by a sand blasting method or a pressing method and then the pair of penetration electrodes 32 and 33 is formed in the plurality of through holes 30 and 31. The electrical conductivity between the upper and lower surface sides of the wafer 40 for base boards is ensured by the pair of penetration electrodes 32 and 33.

Then, in a lead-out electrode forming step S33, the plurality of lead-out electrodes 36 and 37 electrically connected to the penetration electrodes is formed. Then, the steepled bump made of gold or the like is formed on each of the lead-out electrodes 36 and 37. Moreover, in FIG. 9, a bump is not shown in order to improve the viewability of the drawing. At this point of time, the second wafer manufacturing step ends.

Then, as shown in FIG. 10, a mounting step S40 of mounting the mount electrodes 17 and 18, which are formed on the lower surface L of the base portion 12, in a package through the bump B is performed. In this mounting step S40, the mount electrodes 17 and 18 are mounted on the lead-out electrodes 36 and 37 by making the mount electrodes 17 and 18 come in contact with the bumps B, which are formed on the lead-out electrodes 36 and 37, while applying ultrasonic vibration in a state where a bonding head 70 is pressed against the lower surface L of the base portion 12.

Specifically, first, the piezoelectric vibrating reed 2 is picked up by performing vacuum suction or the like on the upper surface U (surface on which electrodes are formed only in a region covered by the passivation film 19) of the piezoelectric vibrating reed 2 using the bonding head 70 of a flip chip bonder, and the piezoelectric vibrating reed 2 is moved onto the base board 3. Then, the mount electrodes 17 and 18 of the piezoelectric vibrating reed 2 are pressed on the bumps B formed on the lead-out electrodes 36 and 37 of the base board 3. Then, bonding surfaces between the mount electrodes 17 and 18 and the lead-out electrodes 36 and 37 are heated up to a predetermined temperature by heat generated by the bonding head 70. By ultrasonically vibrating the bonding head 70 while performing heating and pressing by the bonding head 70, the mount electrodes 17 and 18 on the lower surface L of the piezoelectric vibrating reed 2 are ultrasonically bonded to the bump B. The bonding head 70 vibrates at a frequency of about 15 to 20 kHz, for example, randomly in horizontal and vertical directions with respect to the mount electrodes 17 and 18 of the piezoelectric vibrating reed 2.

Here, since the passivation film 19 is formed of a hard material, such as $SiO_2$, the passivation film 19 does not adhere to the bonding head 70 even if the passivation film 19 and the bonding head 70 come in contact with each other. In addition, since electrodes covered by the passivation film 19 are also protected by the passivation film 19, they do not adhere to the bonding head 70 either.

Moreover, as shown in FIG. 10B, neither mount electrodes nor lead-out electrodes are formed in the region S which is not covered by the passivation film 19. In addition, a clearance corresponding to the thickness of the passivation film 19 and the thicknesses of the respective electrode films is provided between the base portion 12 in the piezoelectric vibrating reed 2 and the bonding head 70. Accordingly, even if the bonding head 70 vibrates randomly in the horizontal and vertical directions with respect to the mount electrodes 17 and 18, the piezoelectric plate 16 and the bonding head 70 do not come in contact with each other. In addition, since the piezoelectric plate 16 is formed of a hard material, such as crystal, a part of the piezoelectric plate 16 does not adhere to the bonding head 70 even if the piezoelectric plate 16 and the bonding head 70 come in contact with each other.

Through the mounting step S40, the piezoelectric vibrating reed 2 is mechanically supported by the bump B and the mount electrodes 17 and 18 and the lead-out electrodes 36 and 37 are electrically connected. Accordingly, at this point of time, the pair of excitation electrodes 15 of the piezoelectric vibrating reed 2 is electrically connected to the pair of penetration electrodes 32 and 33, respectively. In particular, since bump bonding is performed for the piezoelectric vibrating reed 2, the piezoelectric vibrating reed 2 is supported in a state floated from the upper surface of the base board 3. As a result, the piezoelectric vibrating reed 2 can ensure the clearance required for vibration.

After the mounting step S40 of the piezoelectric vibrating reed 2 ends, a superimposition step S50 of superimposing the wafer 50 for lid boards on the wafer 40 for base boards is performed. Specifically, both the wafers 40 and 50 are aligned at the correct positions using reference marks (not shown) as an index. As a result, the mounted piezoelectric vibrating reed 2 is housed in the recess 4a formed in the wafer 40 for base boards and the cavity C surrounded by both the wafers 40 and 50.

After the superimposition step S50, the two superimposed wafers 40 and 50 are put into an anodic bonding device (not shown), and a bonding step S60 of performing anodic bonding by applying a predetermined voltage in the predetermined temperature atmosphere is performed. Specifically, a predetermined voltage is applied between the bonding film 35 and the wafer 40 for base boards. Then, electrochemical reaction occurs on the interface between the bonding film 35 and the wafer 40 for base boards, and both the bonding film 35 and the wafer 40 for base boards come in close contact with each other to be anodically bonded. As a result, since the piezoelectric vibrating reed 2 can be sealed in the cavity C, it is possible to acquire a wafer body 60 shown in FIG. 9 in which the wafer 40 for base boards and the wafer 50 for lid boards are bonded to each other. Moreover, in FIG. 9, in order to increase the viewability, a state where the wafer body 60 is disassembled is shown and illustration of the wafer 50 for lid boards to the bonding film 35 is omitted. In addition, a dotted line shown in FIG. 9 is a cutting line M used for cutting in a cutting step, which will be described later.

Then, in an external electrode forming step S70, the pair of external electrodes 38 and 39 electrically connected to the pair of penetration electrodes 32 and 33 shown in FIG. 6, respectively, is formed in a plural number by patterning a conductive material on the lower surface of the wafer 40 for base boards shown in FIG. 9. Through the external electrode forming step S70, the piezoelectric vibrating reed 2 which is sealed in the cavity C can be operated using the external electrodes 38 and 39.

Then, a fine adjustment step S80 of setting the frequency of each piezoelectric vibrator, which is sealed in the cavity C, to fall within a predetermined range by fine adjustment in a state of the wafer body 60 is performed. Specifically, a voltage is applied to a pair of external electrodes, which is formed on the lower surface of the wafer 40 for base boards, to vibrate the piezoelectric vibrating reed 2. Then, a laser beam is irradiated from the outside through the wafer 40 for base boards while measuring the frequency, so that the fine adjustment film of the weight metal film is evaporated. As a result, since the weight of the pair of vibrating arms at the distal end side thereof changes, the frequency of the piezoelectric vibrating reed 2 can be finely adjusted to fall within a predetermined range of a nominal frequency.

After the fine adjustment of a frequency ends, a cutting step S90 of making the bonded wafer body 60 into pieces by cutting it along the cutting line M shown in FIG. 9. As a result, it is possible to simultaneously manufacture the plurality of surface mount type piezoelectric vibrators shown in FIG. 4, which has a two-layer structure and in which the piezoelectric vibrating reed 2 is sealed in the cavity C formed between the base board 3 and the lid board 4 that are anodically bonded to each other.

Moreover, the fine adjustment step S80 may be performed after cutting the wafer body into pieces of individual piezoelectric vibrators in the cutting step S90. However, as described above, the fine adjustment can be performed in a state of the wafer body 60 by performing the fine adjustment step S80 first. Therefore, in the case of performing the fine adjustment step S80 first, a plurality of piezoelectric vibrators can be finely adjusted more efficiently. This is preferable since the throughput can be improved.

Then, an internal electrical property test is performed (S100). That is, resonance frequency, resonant resistance value, drive level characteristics (exciting power dependency of resonance frequency and resonant resistance value), and the like of the piezoelectric vibrating reed 2 are checked by measurement. Moreover, an insulation resistance characteristic and the like are checked together. Finally, visual inspection of the piezoelectric vibrator is performed to finally check the dimension, quality, and the like. Thus, the manufacturing of the piezoelectric vibrator ends.

In the method of manufacturing a piezoelectric vibrator according to the present embodiment, electrodes disposed on the upper surface U of the base portion 12 are formed only in the region covered by the passivation film 19, as shown in FIGS. 10A and 10B. For this reason, since the bonding head 70 and the electrodes do not come in contact with each other when mounting the piezoelectric vibrating reed 2 by ultrasonic bonding, an electrode material does not adhere to the bonding head 70. Accordingly, an electrode material does not enter between the piezoelectric vibrating reed 2 and the bonding head 70 when picking up the piezoelectric vibrating reed 2, which is to be mounted next, after mounting the piezoelectric vibrating reed 2. As a result, since ultrasonic vibration of the bonding head 70 can be reliably applied to the piezoelectric vibrating reed 2 to be mounted next, the piezoelectric vibrating reed 2 can be reliably bonded ultrasonically. Moreover, since an electrode material does not enter between the piezoelectric vibrating reed 2 and the bonding head 70, manufacturing failure, such as a situation where a piezoelectric vibrating reed is bonded in an inclined state, can be prevented. In addition, since an electrode material does not adhere to the bonding head 70, a head cleaning step is not needed after the mounting step ends. In this manner, a piezoelectric vibrator can be efficiently manufactured. In addition, since electrodes can be covered by a passivation film which originally exists, an increase in manufacturing costs can be suppressed.

(Oscillator)

Next, an oscillator according to another embodiment of the invention will be described with reference to FIG. 11.

Figure 11:
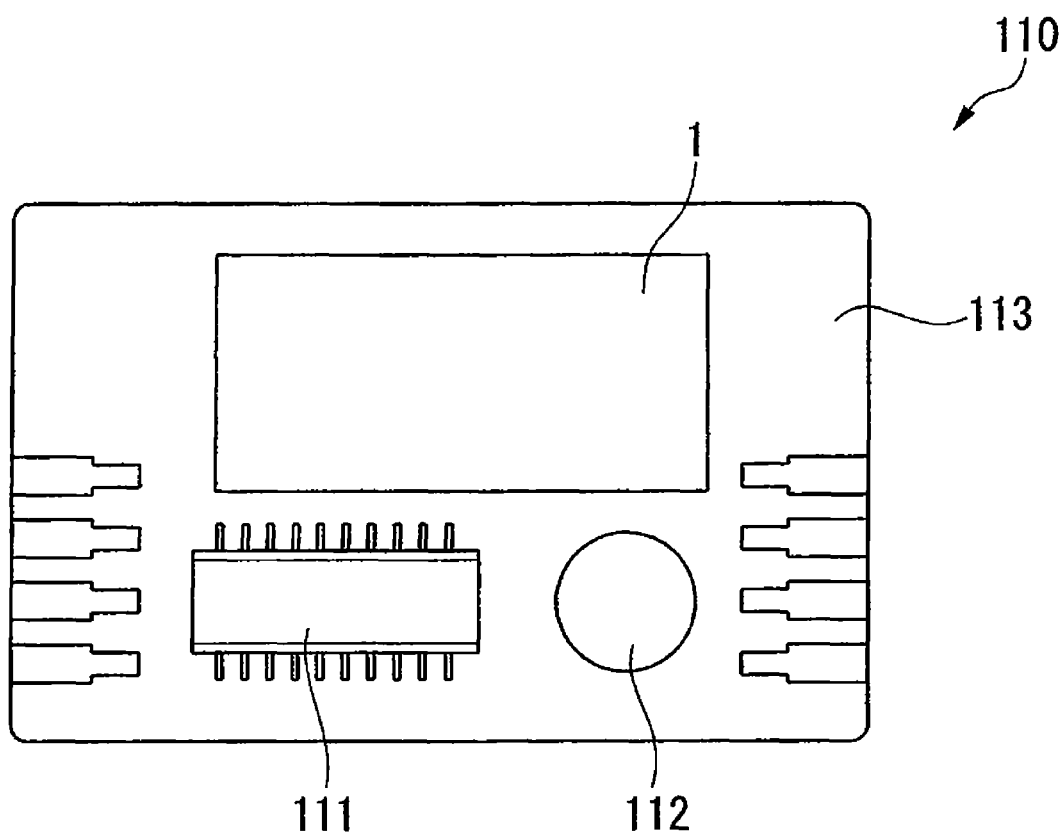
FIG. 11 is a view showing the configuration of an embodiment of an oscillator.

In an oscillator 110 according to the present embodiment, the piezoelectric vibrator 1 is used as a vibrator electrically connected to an integrated circuit 111, as shown in FIG. 11. The oscillator 110 includes a substrate 113 on which an electronic component 112, such as a capacitor, is mounted. The integrated circuit 111 for an oscillator is mounted on the substrate 113, and a piezoelectric vibrating reed of the piezoelectric vibrator 1 is mounted near the integrated circuit 111. The electronic component 112, the integrated circuit 111, and the piezoelectric vibrator 1 are electrically connected to each other by a wiring pattern (not shown). In addition, each of the constituent components is molded with a resin (not shown).

In the oscillator 110 configured as described above, when a voltage is applied to the piezoelectric vibrator 1, the piezoelectric vibrating reed in the piezoelectric vibrator 1 vibrates. This vibration is converted into an electrical signal due to the piezoelectric property of the piezoelectric vibrating reed and is then input to the integrated circuit 111 as the electrical signal. The input electrical signal is subjected to various kinds of processing by the integrated circuit 111 and is then output as a frequency signal. In this way, the piezoelectric vibrator 1 functions as an oscillator.

Moreover, by selectively setting the configuration of the integrated circuit 111, for example, an RTC (real time clock) module, according to the demands, it is possible to add a function of controlling the operation date or time of the corresponding device or an external device or of providing the time or calendar in addition to a single functional oscillator for a timepiece.

As described above, since the oscillator 110 according to the present embodiment includes the piezoelectric vibrator 1 in which a piezoelectric vibrating reed can be reliably bonded ultrasonically and which can be efficiently manufactured, it is possible to provide an oscillator which has good performance at low cost.

(Electronic Apparatus)

Figure 12:
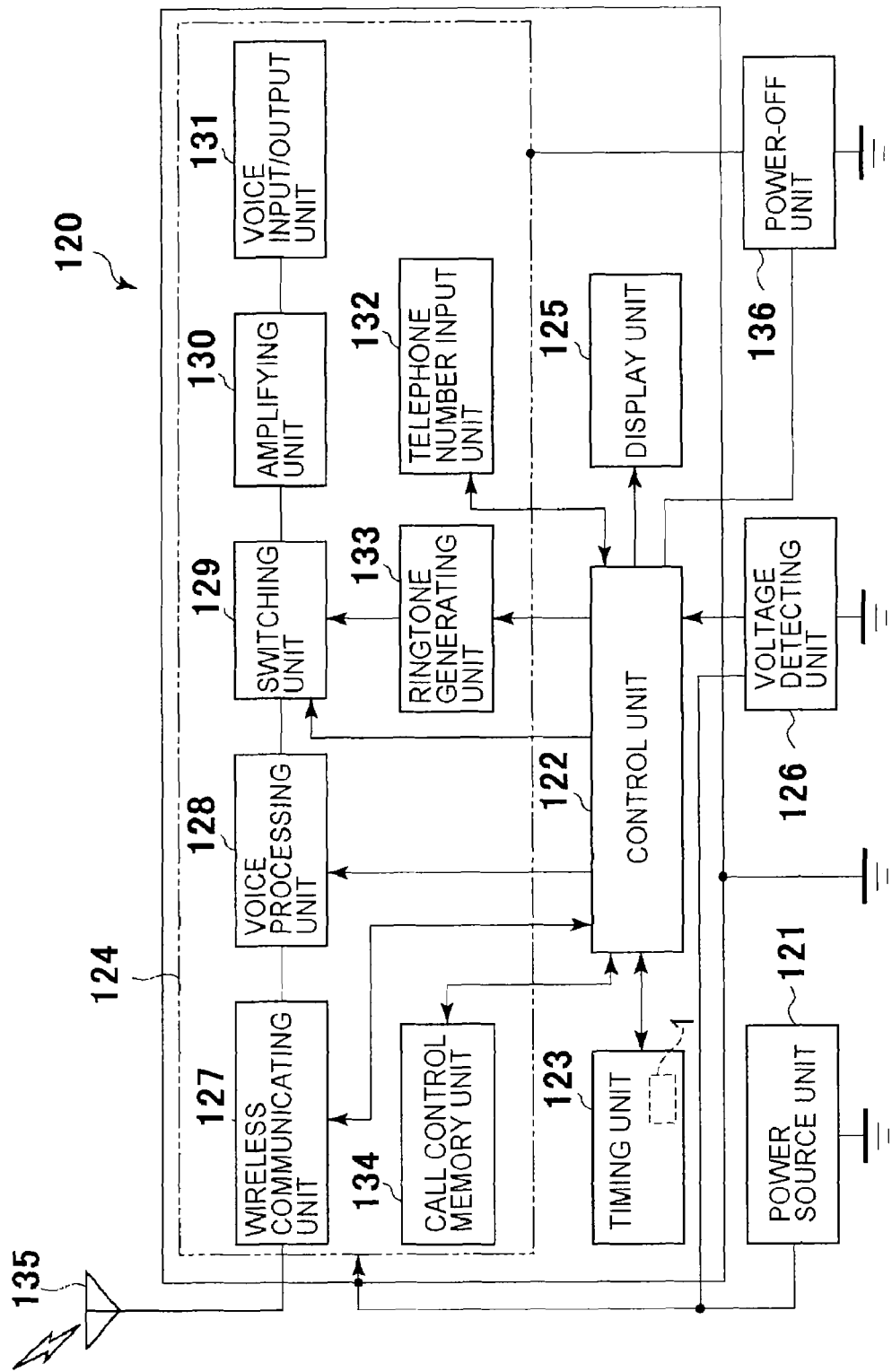
FIG. 12 is a view showing the configuration of an embodiment of an electronic apparatus.

Next, an electronic apparatus according to another embodiment of the invention will be described with reference to FIG. 12. In addition, a portable information device 120 including the piezoelectric vibrator 1 will be described as an example of an electronic apparatus.

The portable information device 120 according to the present embodiment is represented by a mobile phone, for example, and has been developed and improved from a wristwatch in the related art. The portable information device 120 is similar to a wristwatch in external appearance, and a liquid crystal display is disposed in a portion equivalent to a dial pad so that a current time and the like can be displayed on this screen. Moreover, when it is used as a communication apparatus, it is possible to remove it from the wrist and to perform the same communication as a mobile phone in the related art with a speaker and a microphone built in an inner portion of the band. However, the portable information device 120 is very small and light compared with a mobile phone in the related art.

Next, the configuration of the portable information device 120 according to the present embodiment will be described. As shown in FIG. 12, the portable information device 120 includes the piezoelectric vibrator 1 and a power source unit 121 for supplying power. The power source unit 121 is formed of a lithium secondary battery, for example. A CONTROL UNIT 122 which performs various kinds of control, a timing unit 123 which performs counting of time and the like, a communication section 124 which performs communication with the outside, a display unit 125 which displays various kinds of information, and a voltage detecting unit 126 which detects the voltage of each functional section are connected in parallel to the power source unit 121. In addition, the power source unit 121 supplies power to each functional section.

The CONTROL UNIT 122 controls an operation of the entire system. For example, the CONTROL UNIT 112 controls each functional section to transmit or receive the audio data or to measure and display a current time. In addition, the CONTROL UNIT 122 includes a ROM in which a program is written in advance, a CPU which reads and executes a program written in the ROM, a RAM used as a work area of the CPU, and the like.

The timing unit 123 includes an integrated circuit, which has an oscillation circuit, a register circuit, a counter circuit, and an interface circuit therein, and the piezoelectric vibrator 1. When a voltage is applied to the piezoelectric vibrator 1, the piezoelectric vibrating reed vibrates, and this vibration is converted into an electrical signal due to the piezoelectric property of crystal and is then input to the oscillation circuit as the electrical signal. The output of the oscillation circuit is binarized to be counted by the register circuit and the counter circuit. Then, a signal is transmitted to or received from the CONTROL UNIT 122 through the interface circuit, and current time, current date, calendar information, and the like are displayed on the display unit 125.

The communication section 124 has the same function as a mobile phone in the related art, and includes a WIRELESS COMMUNICATING UNIT 127, an Voice Processing Unit 128, a switching unit 129, an amplifier unit 130, an voice input/output unit 131, a telephone number input unit 132, a ring tone generating unit 133, and a call control memory unit 134.

The WIRELESS COMMUNICATING UNIT 127 transmits/receives various kinds of data, such as audio data, to/from the base station through an antenna 135. The Voice Processing Unit 128 encodes and decodes an audio signal input from the WIRELESS COMMUNICATING UNIT 127 or the amplifier unit 130. The amplifier unit 130 amplifies a signal input from the Voice Processing Unit 128 or the voice input/output unit 131 up to a predetermined level. The voice input/output unit 131 is formed by a speaker, a microphone, and the like, and amplifies a ring tone or incoming sound or collects the sound.

In addition, the ring tone generating unit 133 generates a ring tone in response to a call from the base station. The switching unit 129 switches the amplifier unit 130, which is connected to the Voice Processing Unit 128, to the ring tone generating unit 133 only when a call arrives, so that the ring tone generated in the ring tone generating unit 133 is output to the voice input/output unit 131 through the amplifier unit 130.

In addition, the call control memory unit 134 stores a program related to incoming and outgoing call control for communications. Moreover, the telephone number input unit 132 includes, for example, numeric keys from 0 to 9 and other keys. The user inputs a telephone number of a communication destination by pressing these numeric keys and the like.

The voltage detecting unit 126 detects a voltage drop when a voltage, which is applied from the power source unit 121 to each functional section, such as the CONTROL UNIT 122, drops below the predetermined value, and notifies the CONTROL UNIT 122 of the detection. In this case, the predetermined voltage value is a value which is set beforehand as a lowest voltage necessary to operate the communication section 124 stably. For example, it is about 3 V. When the voltage drop is notified from the voltage detecting unit 126, the CONTROL UNIT 122 disables the operation of the WIRELESS COMMUNICATING UNIT 127, the Voice Processing Unit 128, the switching unit 129, and the ring tone generating unit 133. In particular, the operation of the WIRELESS COMMUNICATING UNIT 127 that consumes a large amount of power should be necessarily stopped. In addition, a message informing that the communication section 124 is not available due to insufficient battery power is displayed on the display unit 125.

That is, it is possible to disable the operation of the communication section 124 and display the notice on the display unit 125 by the voltage detection section 126 and the CONTROL UNIT 122. This message may be a character message. Or as a more intuitive indication, a cross mark (X) may be displayed on a telephone icon displayed at the top of the display screen of the display unit 125.

In addition, the function of the communication section 124 can be more reliably stopped by providing a power off unit 136 capable of selectively shutting down the power of a section related to the function of the communication section 124.

As described above, since the portable information device 120 according to the present embodiment includes the piezoelectric vibrator 1 in which a piezoelectric vibrating reed can be reliably bonded ultrasonically and which can be efficiently manufactured, it is possible to provide a portable information device which has good performance at low cost.

(Radio-Controlled Timepiece)

Next, a radio-controlled timepiece according to still another embodiment of the invention will be described with reference to FIG. 13.

Figure 13:
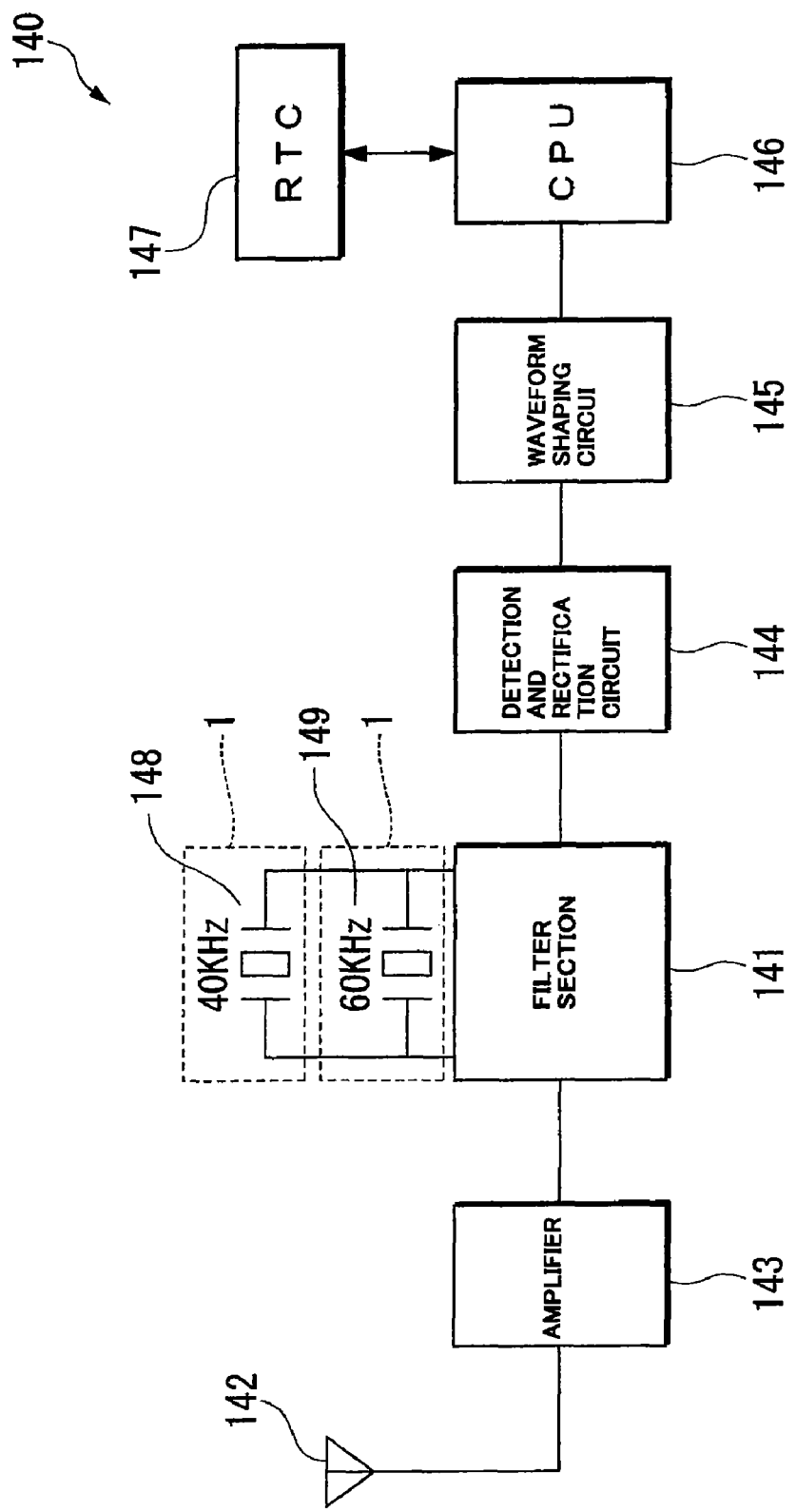
FIG. 13 is a view showing the configuration of an embodiment of a radio-controlled timepiece.

As shown in FIG. 13, a radio-controlled timepiece 140 according to the present embodiment includes the piezoelectric vibrators 1 electrically connected to a filter section 141. The radio-controlled timepiece 140 is a timepiece with a function of receiving a standard radio wave including the clock information, automatically changing it to the correct time, and displaying the correct time.

In Japan, there are transmission centers (transmission stations) that transmit a standard radio wave in Fukushima Prefecture (40 kHz) and Saga Prefecture (60 kHz), and each center transmits the standard radio wave. A long wave with a frequency of, for example, 40 kHz or 60 kHz has both a characteristic of propagating along the land surface and a characteristic of propagating while being reflected between the ionospheric layer and the land surface, and therefore has a propagation range wide enough to cover the entire area in Japan through the two transmission centers.

Hereinafter, the functional configuration of the radio-controlled timepiece 140 will be described in detail.

An antenna 142 receives a long standard radio wave with a frequency of 40 kHz or 60 kHz. The long standard radio wave is obtained by performing AM modulation of the time information, which is called a time code, using a carrier wave with a frequency of 40 kHz or 60 kHz. The received long standard wave is amplified by an amplifier 143 and is then filtered and synchronized by the filter section 141 having the plurality of piezoelectric vibrators 1.

In the present embodiment, the piezoelectric vibrators 1 include crystal vibrator sections 148 and 149 having resonance frequencies of 40 kHz and 60 kHz, respectively, which are the same frequencies as the carrier frequency.

In addition, the filtered signal with a predetermined frequency is detected and demodulated by a detection and rectification circuit 144.

Then, the time code is extracted by a waveform shaping circuit 145 and counted by the CPU 146. The CPU 146 reads the information including the current year, the total number of days, the day of the week, the time, and the like. The read information is reflected on an RTC 148, and the correct time information is displayed.

Because the carrier wave is 40 kHz or 60 kHz, a vibrator having the tuning fork structure described above is suitable for the crystal vibrator sections 148 and 149.

Moreover, although the above explanation has been given for the case in Japan, the frequency of a long standard wave is different in other countries. For example, a standard wave of 77.5 kHz is used in Germany. Therefore, when the radio-controlled timepiece 140 which is also operable in other countries is assembled in a portable device, the piezoelectric vibrator 1 corresponding to frequencies different from the frequencies used in Japan is necessary.

As described above, since the radio-controlled timepiece 140 according to the present embodiment includes the piezoelectric vibrator 1 in which a piezoelectric vibrating reed can be reliably bonded ultrasonically and which can be efficiently manufactured, it is possible to provide a radio-controlled timepiece which has good performance at low cost.

In addition, the invention is not limited to the embodiments described above.

In the present embodiment, the tuning fork type piezoelectric vibrating reed and the piezoelectric vibrator using the tuning fork type piezoelectric vibrating reed have been described as examples. However, it is also possible to adopt an AT cut type piezoelectric vibrating reed (thickness-shear vibrating reed) and a piezoelectric vibrator using the AT cut type piezoelectric vibrating reed, for example.

Moreover, in the present embodiment, mount electrodes are formed only on the lower surface of a base portion and accordingly, passivation films of the upper and lower surfaces are formed in the same region. However, the mount electrodes may also be formed on the upper surface of the base portion so that the passivation film can be formed to cover the mount electrodes. In this case, however, the passivation films are formed in different regions of the upper and lower surfaces. On the other hand, in the above-described embodiment in which passivation films of the upper and lower surfaces are formed in the same region, a metal mask can be used in common on the upper and lower surfaces. Accordingly, the present embodiment is better in terms of manufacturing costs.

What is claimed is:

1. A piezoelectric vibrating reed comprising:
a first surface on which excitation electrodes are patterned;
a first insulating layer extensive to cover at least the entire excitation electrodes patterned on the first surface;
a second surface on which the excitation electrodes and mount electrodes electrically connected to the excitation electrodes are patterned; and
a second insulating layer extensive to cover at least the entire excitation electrodes patterned on the second surface but short to cover the at least a part of the mount electrodes.

2. The piezoelectric vibrating reed according to claim 1, wherein the first and second insulating layers are extensive similarly.

3. The piezoelectric vibrating reed according to claim 1, wherein the first and second insulating layers are as extensive as the excitation electrodes.

4. The piezoelectric vibrating reed according to claim 1, wherein the first and second insulating layers are made of $SiO_2$.

5. The piezoelectric vibrating reed according to claim 1, wherein the excitation electrodes consist of a single layer made of Cr, and the mount electrodes comprise two metal layers made of Cr and Au.

6. A piezoelectric vibrator comprising:
a first substrate having conductive bumps formed thereon;
the piezoelectric vibrating reed according to claim 1 mounted on the first substrate, wherein the mount electrodes are electrically connected to the bumps; and
a second substrate which hermetically closes the first substrate with the piezoelectric vibrating reed inside therebetween.

7. An oscillator comprising the piezoelectric vibrator defined in claim 6.

8. An electronic device comprising the piezoelectric vibrator defined in claim 6.

9. The electronic device according to claim 8, wherein the electronic device is an atomic clock.

10. A method of manufacturing a piezoelectric vibrator, comprising:
forming excitation electrodes on a first surface of a crystal piece and excitation electrodes and mount electrodes on a second surface of the crystal piece;
forming a first insulating layer extensive to cover at least the entire excitation electrodes formed on the first surface of the crystal piece; and
forming a second insulating layer extensive to cover at least the entire excitation electrode formed on the second surface of the crystal piece bur short to cover at least a part of the mount electrodes.

11. The method according to claim 10, wherein forming excitation electrodes comprises forming excitation layers comparing two metal layers made of Cr and Au.

12. The method according to claim 11, further comprising partially removing the Au layer from the excitation electrodes, wherein the first and second insulating layer are formed on the excitation electrodes where the Au layer is removed.

13. The method according to claim 10, wherein the first and second insulating layers are made of $SiO_2$.

14. The method according to claim 10, wherein the first and second insulating layers are formed using a CVD method.

15. The method according to claim 10, wherein forming a first insulating layer comprises placing a metal mask on the first surface of the crystal piece and applying the first insulating layer on the metal mask to form the first insulating layer only to cover at least the entire excitation electrode formed on the first surface of the crystal piece.

16. The method according to claim 15, wherein forming a second insulating layer comprises placing the same metal mask on the second surface of the crystal piece and applying the second insulating layer on the metal mask to form the second insulating layer to cover at least the entire excitation electrode formed on the second surface of the crystal piece but short to cover at least a part of the mount electrode.

17. The method according to claim 10, further comprising forming a weight film on the crystal piece and removing a part of the weight film by a laser to adjust a frequency of the piezoelectric vibrator.

* * * * *